US007119342B2

(12) United States Patent
Syage et al.

(10) Patent No.: US 7,119,342 B2
(45) Date of Patent: Oct. 10, 2006

(54) INTERFACES FOR A PHOTOIONIZATION MASS SPECTROMETER

(75) Inventors: Jack A. Syage, Huntington Beach, CA (US); Karl A. Hanold, Huntington Beach, CA (US); Matthew D. Evans, Irvine, CA (US); Brian J. Nies, Tustin, CA (US)

(73) Assignee: Syagen Technology, Tustin, CA (US)

( * ) Notice: Subject to any disclaimer, the term of this patent is extended or adjusted under 35 U.S.C. 154(b) by 0 days.

(21) Appl. No.: 10/334,506

(22) Filed: Dec. 31, 2002

(65) Prior Publication Data

US 2003/0155500 A1 Aug. 21, 2003

Related U.S. Application Data

(63) Continuation-in-part of application No. 09/596,307, filed on May 14, 2000, now Pat. No. 6,630,684, which is a continuation-in-part of application No. 09/247, 646, filed on Feb. 9, 1999, now Pat. No. 6,211,518.

(51) Int. Cl.
*H01J 37/08* (2006.01)
*H01J 49/10* (2006.01)

(52) U.S. Cl. .................................. 250/423 P; 250/288

(58) Field of Classification Search ................ 250/288, 250/423 P, 252.1
See application file for complete search history.

(56) References Cited

U.S. PATENT DOCUMENTS 3,555,272 A 1/1971 Munson et al.
4,008,388 A * 2/1977 McLafferty et al. ........ 250/288
4,014,793 A * 3/1977 Tesarik et al. ........... 210/198.2
4,365,157 A 12/1982 Unsold et al.
4,517,850 A * 5/1985 Wiseman et al. ........ 73/864.21
4,540,884 A 9/1985 Stafford et al.
4,733,073 A 3/1988 Becker et al.
4,780,608 A 10/1988 Cross et al.
4,804,846 A 2/1989 Hall
4,849,628 A 7/1989 McLuckey et al.
4,855,594 A * 8/1989 Kimock et al. ............ 250/288
4,861,988 A 8/1989 Henion et al.
4,876,502 A 10/1989 Verbanets et al.
4,931,640 A 6/1990 Marshall et al.
4,968,885 A * 11/1990 Willoughby ................ 250/288

(Continued)

OTHER PUBLICATIONS

Mahon, et al, "Third-Harmonic Generation in Argon, Krypton, and Xenon: Bandwidth Limitations in the Vinicity of Lyman-a", IEEE Journal of Quantum Electronics, vol. QE-15, No. 6, Jun. 1979, pp. 444-451.

(Continued)

*Primary Examiner*—Jack I. Berman
(74) *Attorney, Agent, or Firm*—Ben J. Yorks; Irell & Manella LLP

(57) ABSTRACT

A detector system that contains two inlet port coupled to a photoionization chamber. One inlet port allows for the introduction of a test sample. The test sample may contain contaminants, drugs, explosive, etc. that are to be detected. The other port allows for the simultaneous introduction of a standard sample. The standard sample can be used to calibrate and/or diagnose the detector system. Simultaneous introduction of the standard sample provides for real time calibration/diagnostics of the detector during detection of trace molecules in the test sample. The photoizonizer ionizes the samples which are then directed into a mass detector for detection of trace molecules. The detector system may also include inlet embodiments that allow for vaporization of liquid samples introduced to a low pressure photoionizer.

2 Claims, 6 Drawing Sheets

U.S. PATENT DOCUMENTS

| | | | | |
|---|---|---|---|---|
| 5,032,721 | A | 7/1991 | Bacon et al. | |
| 5,068,658 | A | 11/1991 | Ohlsson et al. | |
| 5,070,240 | A | 12/1991 | Lee et al. | |
| 5,138,552 | A | 8/1992 | Weedon et al. | |
| 5,153,672 | A | 10/1992 | Globig et al. | |
| 5,198,816 | A | 3/1993 | Kalinowski et al. | |
| 5,206,594 | A | 4/1993 | Zipf | |
| 5,234,838 | A | 8/1993 | Bacon, Jr. | |
| 5,248,973 | A | 9/1993 | Babu et al. | |
| 5,283,436 | A | 2/1994 | Wang | |
| 5,289,529 | A | 2/1994 | Karnowski | |
| 5,294,797 | A | 3/1994 | Frey et al. | |
| 5,311,016 | A | 5/1994 | Villa-Aleman | |
| 5,338,931 | A | 8/1994 | Spangler et al. | |
| 5,343,488 | A | 8/1994 | Guyot et al. | |
| 5,381,006 | A | 1/1995 | Wells et al. | |
| 5,393,979 | A | 2/1995 | Hsi | |
| 5,397,895 | A | 3/1995 | Leone et al. | |
| 5,412,207 | A | 5/1995 | Micco et al. | |
| 5,422,575 | A | 6/1995 | Ferrer et al. | |
| 5,422,643 | A | 6/1995 | Chu et al. | |
| 5,469,323 | A | 11/1995 | Kanayama | |
| 5,504,328 | A | 4/1996 | Bonser | |
| 5,527,731 | A | 6/1996 | Yamamoto et al. | |
| 5,554,846 | A | 9/1996 | Regiec et al. | |
| 5,568,144 | A | 10/1996 | Chiao et al. | |
| 5,569,917 | A | 10/1996 | Buttrill, Jr. et al. | |
| 5,630,221 | A | 5/1997 | Birleson | |
| 5,631,462 | A | 5/1997 | Reents, Jr. | |
| 5,808,299 | A | 9/1998 | Syage | |
| 5,826,214 | A | 10/1998 | Lieb et al. | |
| 5,854,431 | A | 12/1998 | Linker et al. | |
| 5,869,832 | A | 2/1999 | Wang et al. | |
| 5,906,946 | A | 5/1999 | Sausa et al. | |
| 6,011,259 | A | 1/2000 | Whitehouse et al. | |
| 6,028,543 | A | 2/2000 | Gedcke et al. | |
| 6,040,575 | A | 3/2000 | Whitehouse et al. | |
| 6,140,638 | A | 10/2000 | Tanner et al. | |
| 6,166,379 | A * | 12/2000 | Montaser et al. | 250/288 |
| 6,211,516 | B1 | 4/2001 | Syage et al. | |
| 6,534,765 | B1 * | 3/2003 | Robb et al. | 250/288 |
| 2003/0155505 | A1 * | 8/2003 | Russ et al. | 250/288 |

OTHER PUBLICATIONS

Rettner, et al, "Pulsed Free Jets: Novel Nonlinear Media for Generation of Vacuum Ultraviolet and Extreme Ultraviolet Radiation", The Journal of Physical Chemistry, vol. 88, No. 20, 1984, pp. 4459-4465.

Tonkyn, et al, "Compact Vacuum Ultraviolet Source for Photoelectron Spectroscopy", Rev. Sci. Instrum. vol. 60, No. 7, Jul. 1989, pp. 1245-1251.

R. Wallenstein, "Generation of Narrowband Tunable VUV Radiation at the Lyman-a Wavelength", Optics Communications, vol. 33, No. 1, Apr. 1980; pp. 119-122.

R. Hilbig, et al, "Tunable VUV Radiation Generated by Two-Photon Resonant Frequency Mixing in Xenon", IEEE Journal of Quantum Electronics, vol. QE-19, No. 2, Feb. 1983, pp. 194-201.

Jack A. Syage, "Real-Time Detection of Chemical Agents Using Molecular Beam Laser Mass Spectrometry", American Chemical Society, 1990.

David M. Lubman, "Laser and Mass Spectrometry", Oxford University Press, 1990, pp. 469-489.

Nesselrodt et al., Cyclic Ketone Mixture Analysis using 2+1 Resonance-Enhanced Multiphoton Ionization Mass Spectrometry.

R. Frey, et al. "Real-Time Vehicle Exhaust Analysis Using a Laser TOF Mass Spectrometer", Proc. 40th Anal. Conf. Mass Spectrom & Allied Topics, 1992, pp. 678-679.

R. Trembreull, et al. Pulsed Laser Desorption of Biological Molecules in Supersonic Beam Mass Spectrometry with Resonant Two-Photon Ionization Detection.

Steven M. Michael, "An Ion Trap Storage/Time-of-Flight Mass Spectrometer", pp. 4277-4284.

Mark G. Qian et al, A Hybrid Instrument That Combines TOF With The Ion Trap Yields Excellent Sensitivity For Small Samples.

E.R. Rohwer, R.C. Beavis,C. Koster, J. Lindner, J. Grotemeyer and E.W. Schlag, "Fast Pulsed Laser Induced Electron Generation for Electron Impact Mass Spectrometry", Nov. 23, 1988, pp. 1151-1153.

J.G. Boyle, L.D. Pfefferle, E.E. Gulcicek, S.D. Colson, "Laser-driven Electron Ionization for a VUV Photoionization Time-Of-Flight Mass Spectrometer", (11) pages; American Institute of Physics.

P. Y. Cheng and H.L. Dai, "A Photoemitted Electron-Impact Ionization Method For Time-Of-Flight Mass Spectrometers", pp. 2211-2214, American Institute of Physics.

U. Boesi et al. "Laser Ion Sources For Time-Of-Flight Mass Spectrometry", Int. J. Mass Spectrom. Ion Processes 131 (1994) 87-124.

* cited by examiner

INTERFACES FOR A PHOTOIONIZATION MASS SPECTROMETER

CROSS REFERENCE TO RELATED APPLICATIONS

This application is a continuation-in-part of application Ser. No. 09/596,307, filed on Jun. 14, 2000, now U.S. Pat. No. 6,630,684, which is a continuation-in-part of application Ser. No. 09/247,646, filed on Feb. 9, 1999, U.S. Pat. No. 6,211,516.

BACKGROUND OF THE INVENTION

1. Field of the Invention

The subject matter disclosed generally relates to a detector that can detect trace molecules.

2. Background Information

There are detectors that are capable of detecting a trace molecule from a sample. The sample may be a gas or liquid sample taken from a room or a fluid source, respectively. It may be desirable to detect certain trace molecules to determine whether the sample contains contaminants, drugs, explosives, etc.

The detector may include an ionization stage and a mass detector stage. The ionization stage ionizes molecules within the sample and then projects the ionized molecules through the mass detector. The mass detector may be a time of flight device that determines mass based on the time at which the molecules strike a detector plate. The ionization chamber may include a light source that ionizes the sample through a photoionization process.

The sample is introduced into the ionization chamber through a single inlet port. To obtain accurate readings it is desirable to calibrate the detector before each sample is run through the device. The detector is calibrated by introducing a standard sample that may contain the molecules under investigation. Obtaining accurate readings therefore requires sequentially loading a standard sample, calibrating the detector and then introducing a test sample into the ionization chamber. This sequence can be time consuming particularly when large batches of samples are to be tested. Additionally, there may be some degradation in the detector between the time the detector is calibrated and when the test sample is actually loaded into the chamber. It would be desirable to decrease the run time and increase the accuracy of a detector.

Liquid test samples typically include water or drug samples stored in organic solvents. It is desirable to vaporize the solvent before the sample is ionized. One way to vaporize the solvent is to break the sample into aerosol droplets with a nebulizer. A nebulizer includes a co-flow of inert gas that breaks the liquid sample into an aerosol. The detector may contain a heating element that vaporizes the solvent within the aerosol.

Most nebulizers operate at atmospheric pressure because higher pressure causes more molecular collisions and assist in the vaporization process. It is sometimes desirable to operate the ionization chamber at low pressure, particularly for photoionizers. It would be desirable to provide an inlet port for liquid samples that can introduce the sample to a low pressure ionization chamber.

BRIEF SUMMARY OF THE INVENTION

A detector system that includes a detector coupled to a photoionizer. The system may also include a first inlet port and a second inlet port that are both coupled to the photoionizer.

DETAILED DESCRIPTION

Disclosed is a detector system that contains two inlet ports coupled to a photoionization chamber. One inlet port allows for the introduction of a test sample. The test sample may contain contaminants, drugs, explosive, etc. that are to be detected. The other port allows for the simultaneous introduction of a standard sample. The standard sample can be used to calibrate and/or diagnose the detector system. Simultaneous introduction of the standard sample provides for real time calibration/diagnostics of the detector during detection of trace molecules in the test sample. The photoionizer ionizes the samples that are then directed into a mass detector for detection of trace molecules. The detector system may also include inlet embodiments that allow for vaporization of liquid samples introduced to a low pressure photoionizer.

Figure 1:
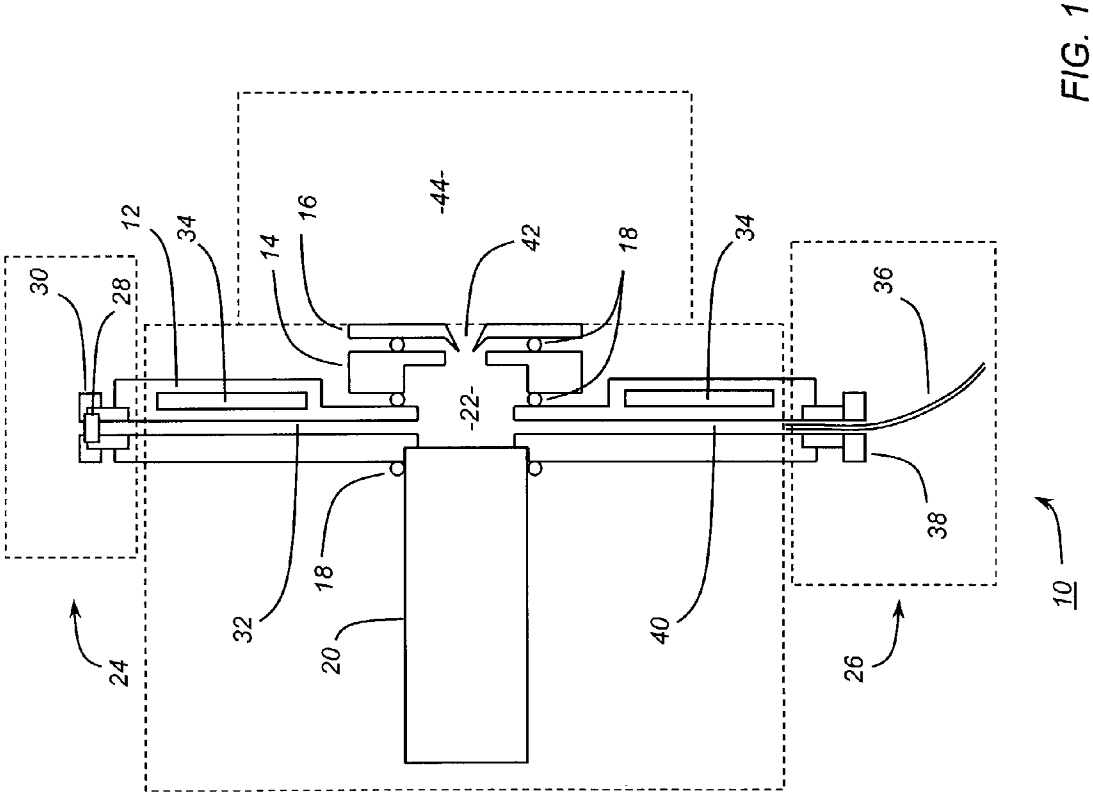
FIG. 1 is an illustration of a detector system.

Referring to the drawings more particularly by reference numbers, FIG. 1 shows a detector system 10. The detector system 10 may include a housing 12, electrostatic lenses 14 and 16, sealing elements 18 and an ionizer 20 that surround an ionization chamber 22. In one embodiment the ionizer 20 is a light source that can photoionize molecules within the chamber 22. By way of example, the light source can emit light having photo-energy between 8.0 and 12.0 electron volts (eV). 8.0 to 12.0 eV is high enough to ionize most trace molecules while minimizing molecular fragmentation within the sample.

The detector system 10 may include a first inlet port 24 and a second inlet port 26 that are coupled to the ionization chamber 22. The inlet port 24 allows a test sample to be introduced to the ionization chamber 22. The test sample may contain contaminants, drugs, explosives, etc. that are to be detected by the detector system 10. The second inlet port 26 allows for the introduction of a standard sample that can be used to calibrate and/or diagnose the detector system 10. The standard sample may be introduced in a continuous manner so that there is a consistent flow of the sample. The test sample is typically introduced through a syringe. Consequently, the introduction of the test sample is a transient event. Both the test sample and the standard sample may be either a liquid or gas flow.

The first inlet port 24 may include a septum 28 and a septum cap 30. The septum 28 can receive the needle of a syringe (not shown). The first inlet port 24 may be coupled to the ionization chamber 22 by a channel 32. The housing 12 may include a heating element 34 embedded in the housing 12 to heat the channel 32. The heating element 34 may operate at a temperature that vaporizes solvents in the test sample. For example, the heating element 34 may operate between 100 and 400 degrees centigrade.

The second inlet port 26 may include a capillary tube 36 that extends through a tube fitting 38. The housing 12 includes another channel 40 that provides fluid communication between the tube 36 and the ionization chamber 22. The heating element 34 also extends to the channel 40 to vaporize the sample introduced through the capillary tube 36. Although the first inlet port 24 is shown as having a septum, it is to be understood that the first port 24 may have the capillary tube arrangement of the second port 26.

The ionizer 20 ionizes the samples introduced to the ionization chamber 22. The lenses 14 and 16 then pull the ionized molecules of the samples through an aperture 42 and into a mass detector 44. The mass detector 44 may be a time of flight device that can detect the trace molecules based on the time required to strike a detector plate (not shown) within the detector 44. Although a time of flight mass detector is described, it is to be understood that other types of detector devices may be used in the system 10.

Figure 2A:
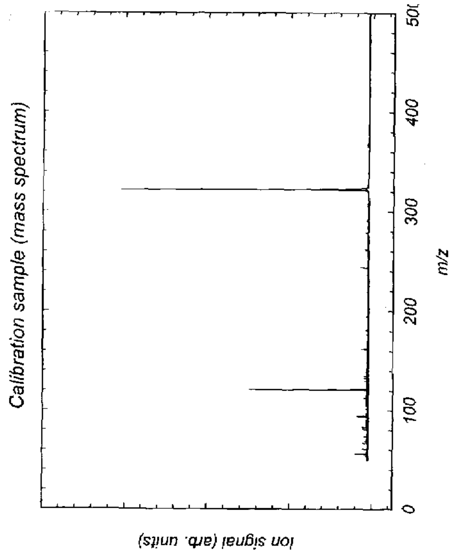
FIGS. 2A–B are graphs showing the detection of a standard sample introduced to the detector.
Figure 2B:
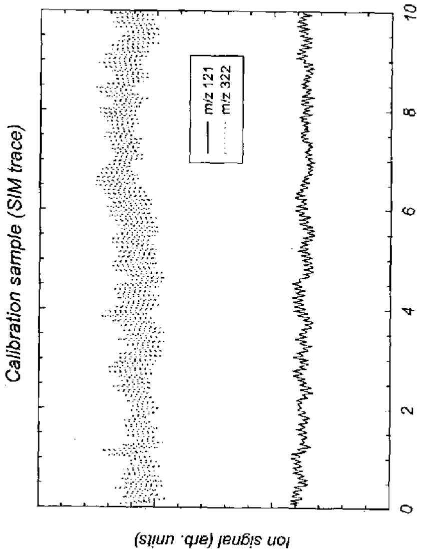

FIGS. 2A and 2B show a mass spectrum and a time dependent profile, respectively, for a standard sample introduced to the detector. The standard sample can be used to calibrate and/or diagnose the detector system.

Figure 3A:
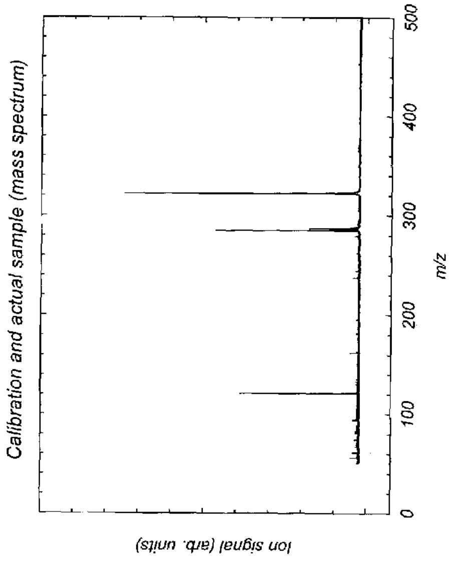
FIGS. 3A–B are graphs-showing the detection of a test sample and standard sample simultaneously introduced to the detector.
Figure 3B:
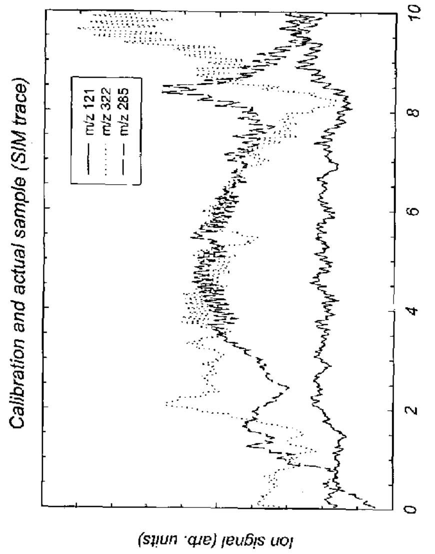

FIGS. 3A and 3B show a mass spectrum and a time dependent profile, respectively, for a combined standard sample and a test sample that contains diazepam in methanol, introduced to the detector system 10. As shown in FIG. 3B, the sample signal rises and falls with the introduction of the test sample.

Figure 5:
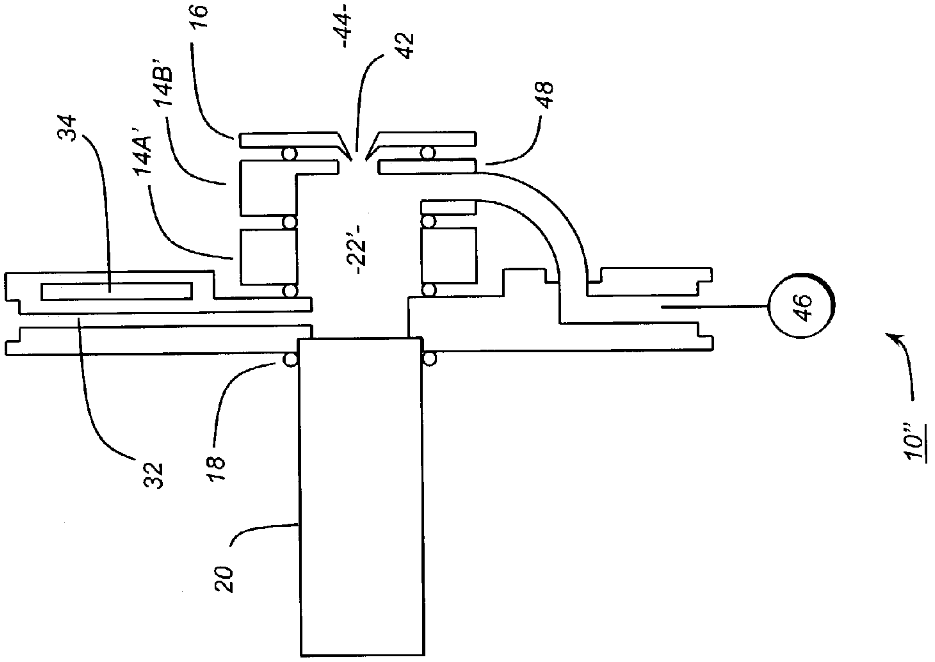
FIG. 5 is an illustration of an alternate embodiment of the detector.
Figure 4:
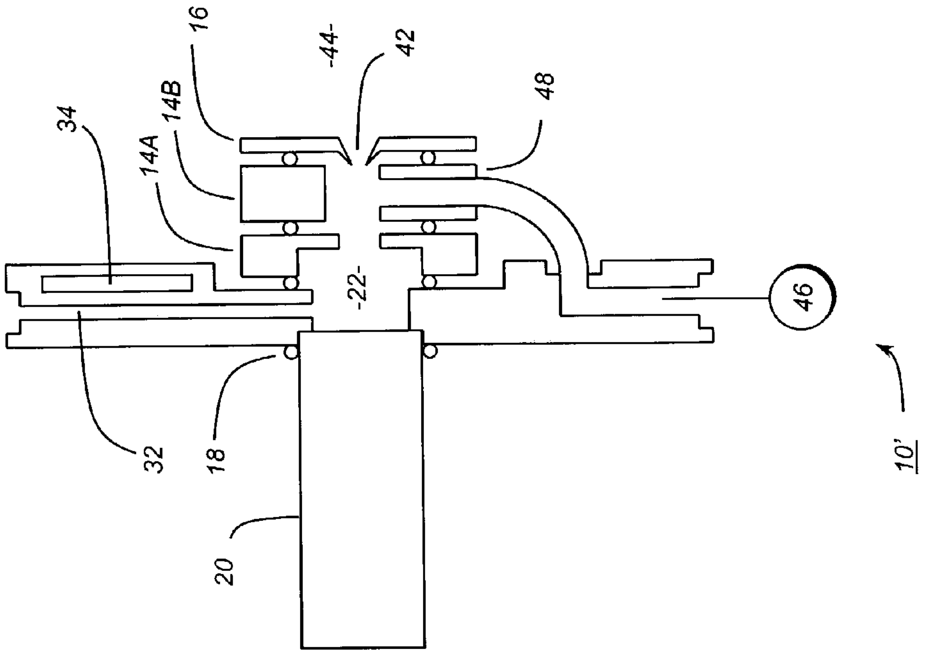
FIG. 4 is an illustration of an alternate embodiment of the detector.

FIG. 4 shows an alternate embodiment, wherein the detector 10' includes a pump 46 that removes a portion of the samples. It is desirable to control the flow of the samples from the ionization chamber 22 to the mass detector 44. An excessive flow may create an undesirably high pressure within the mass detector 44. A pump-out channel 48 may be connected to a point between the ionization chamber 22 and the aperture 42 to divert some of the ionized molecules away from the mass detector 44. FIG. 5 shows an embodiment of a detector 10" wherein the channel 48 terminates in the ionization chamber 22'.

Figure 6:
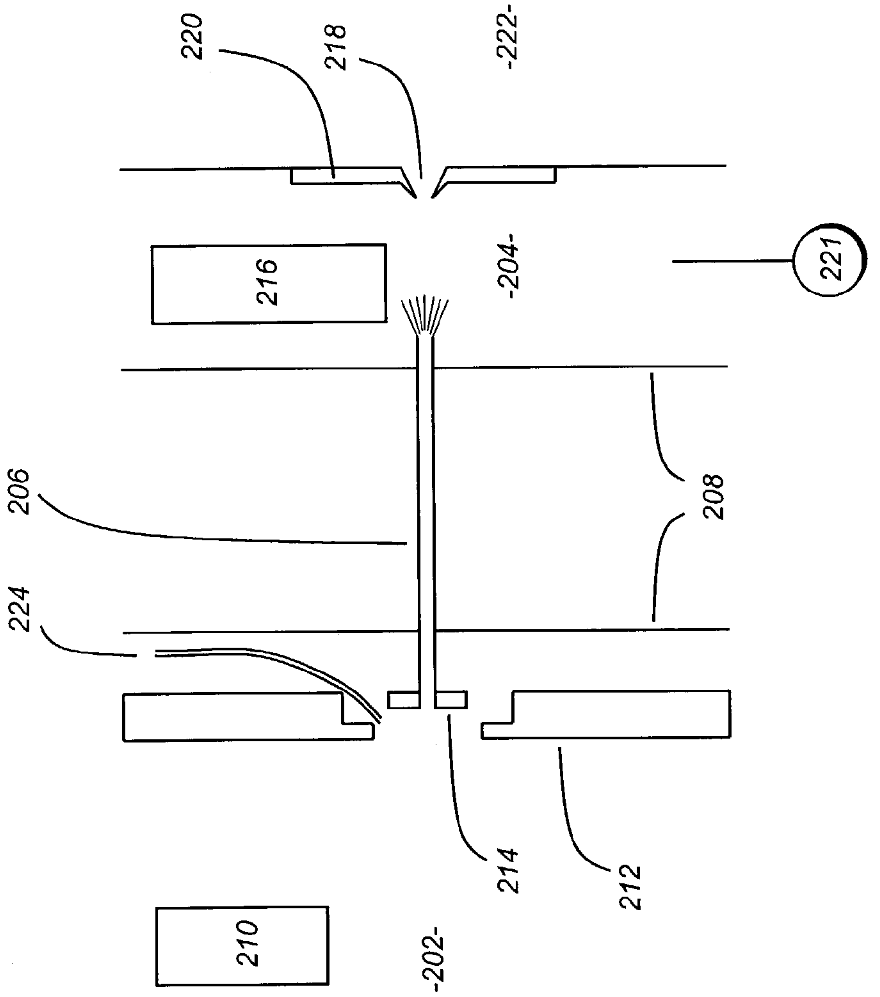
FIG. 6 is an illustration of an alternate embodiment of the detector.

FIG. 6 shows another embodiment of a detector system 200 that includes a first ionization chamber 202 coupled to a second ionization chamber 204 by a capillary tube 206. The chambers 202 and 204 may be separated by interface walls 208.

The first ionization chamber 202 may include a first ionizer 210. The first ionizer 210 may be of any type to ionize molecules within the first chamber 202. The ionized molecules within the first chamber 202 are focused into the capillary tube 206 by electrostatic lenses 212 and 214. The first ionization chamber 202 operates at a higher pressure than the second chamber 204. The pressure differential drives the ionized molecules from the first chamber 202, through the tube 206 and into the second chamber 204.

By way of example, the first chamber 202 may operate at atmospheric pressure. Such a high pressure may induce molecular collisions and reactions that can change the identity of the ions. The second ionization chamber 204 may contain a second ionizer 216 that further ionizes the sample. Further ionization may generate the original ions and therefore restore the identity of the ions. The second ionizer 216 may be a photoionizer. A photoionizer may ionize molecules not ionized by the first ionizer 208 and thus provide more information. Additionally, a photoionizer is desirable because it does not use electric fields and therefore such a device will not interfere with ionized molecules traveling through the aperture 218 of the focusing lens 220 to the mass detector 222.

Figure 7:
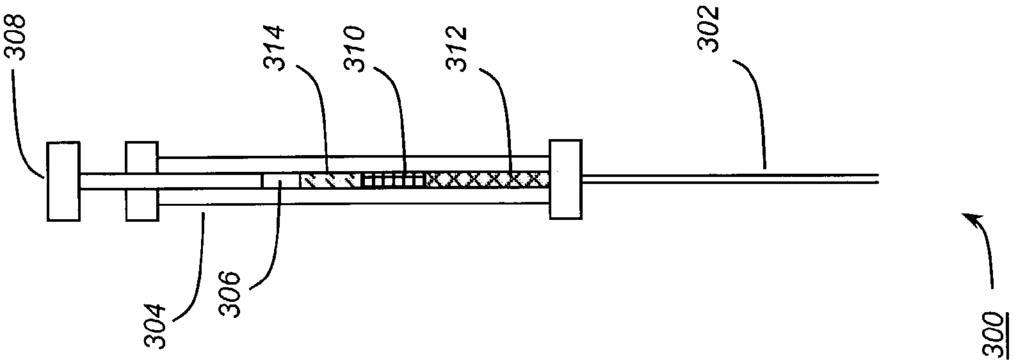
FIG. 7 is an illustration of a syringe used to introduce a test sample into the detector.

A second capillary tube 224 can be placed adjacent to the first tube 206. The second capillary tube 224 may provide a standard sample that is not ionized within the first ionization chamber 202. The standard sample flows into the second chamber 204 due to the differential chamber pressure. The standard and test samples are ultimately detected within the mass detector 222, FIG. 7 discloses a syringe 300 that can be used to introduce a test sample into the detector system. The syringe 300 may include a needle 302 that is attached to a tube 304. The tube 304 has an inner chamber 306. A plunger 308 extends into the inner chamber 306 of the tube 304.

The syringe 300 may be loaded with a liquid test sample 310 that is upstream from a volume of air 312. The air mixes with and dilutes the liquid test sample to increase the delivery time of the test sample into the detector system. It is desirable to increase the delivery time to improve the vaporization of the solvent in the sample. The mixing of the air and liquid sample also allows for a larger syringe needle 302 that is less susceptible to clogging and condensation. The air volume may also nebulize the liquid into an aerosol. An aerosol state is preferred to induce vaporization of the solvent within the liquid sample.

A low pressure source can draw out the sample in a syringe without using the plunger. It is sometimes desirable to control the rate of sample delivery. The combination of air and liquid reduces the total mass flow rate into the detector system, which reduces the pressure surge that can result from injection of a pure liquid sample. The volume flow rate of a gas is typically about 30 times greater than for a liquid. However, because the density of gas is about 1/600 of the density of the liquid, the mass flow rate of the gas is about 20 times less than for the liquid. It is desirable to have a significantly high air to liquid ratio (much more air than liquid), but the ratio of gas to liquid should be no less than 1:1.

The syringe may contain a solvent slug 314 that washes out any residual sample within the needle 302. It has been found that analyte may condense within the needle 302 of the syringe 300. The solvent slug 314 will wash through any such condensation. The solvent slug 314 may include the standard sample used to calibrate and/or diagnose the detector system. By way of example, the syringe 300 may contain 5 microliters of air 312, 1 microliter of sample liquid 310 and 1 microliter of solvent slug 314.

Figure 8:
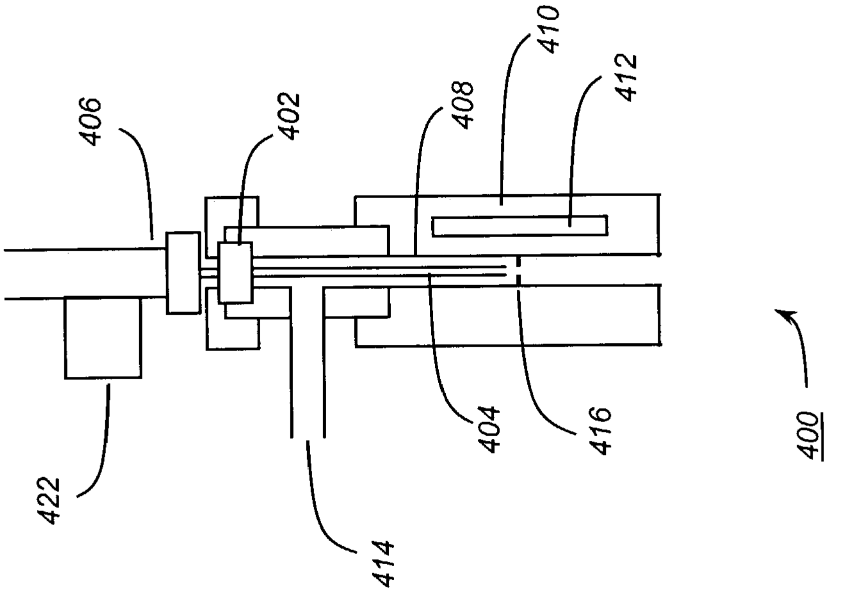
FIG. 8 is an illustration of a nebulizing inlet port that receives a syringe.

FIG. 8 shows an embodiment of an inlet port 400 with an integrated nebulizer. The inlet port 400 is coupled to an ionization chamber (not shown). The inlet port 400 includes a septum 402 that receives a needle 404 of a syringe 406. The syringe 406 can inject a sample into an inner channel 408 of a housing 410. The housing 410 may include a heating element 412.

The inlet port 400 may further have a co-flow port 414 that introduces a gas into the inner channel 408. The gas introduced through the co-flow port 414 breaks the liquid into an aerosol. The aerosol facilitates the vaporization of solvents and analyte molecules on the heating element 412. The inlet port 400 may further includes a restrictor 416 that induces a vigorous mixing of the air and liquid sample into aerosol droplets. The aerosol droplets are pulled through the restrictor 416 by the pressure differential between the channel 408 and the ionization chamber (not shown) of the detector system.

Figure 9:
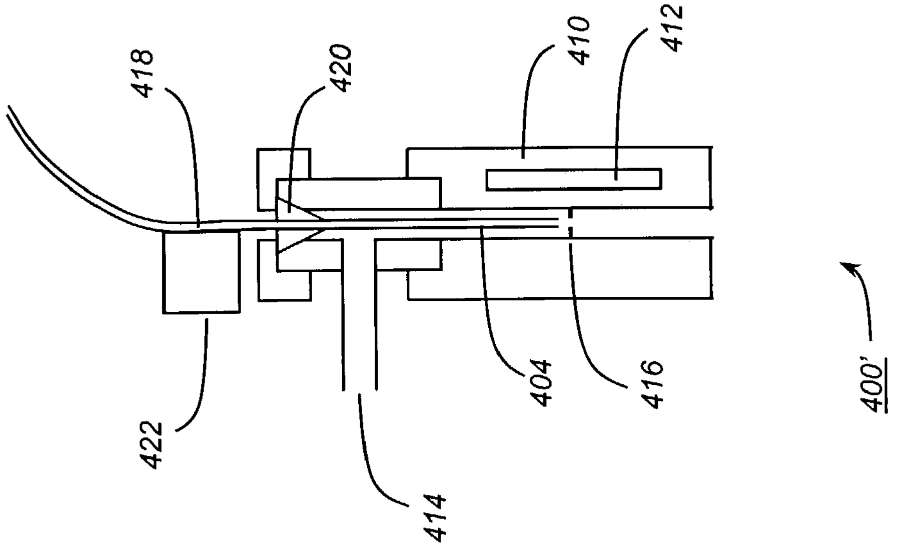
FIG. 9 is an illustration of a nebulizing inlet port that receives a capillary tube.

FIG. 9 shows an alternate embodiment of an inlet port 400' that utilizes a capillary tube 418 and tube interface 420 instead of the syringe 406 and septum 402 shown in FIG. 8.

The generation of aerosol droplets and vaporization can be augmented by a vibrator 422. The vibrator 422 may contain piezoelectric elements or other means for shaking either the syringe 406 or capillary tube 418. The vibration may break the liquid stream into small aerosol droplets.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A detector system, comprising:

a photoionizer;

an inlet port coupled to said photoionizer, said inlet port includes a nebulizer and a syringe port with a septa that allows for an introduction of a sample from a syringe;

an ionization chamber coupled to said photoionizer, said ionization chamber having a pressure that pulls the sample from said inlet port; and, a detector coupled to said photoionizer.

2. The system of claim 1, further comprising a pump coupled to said photoionizer.

* * * * *